United States Patent [19]
Glassman et al.

[11] Patent Number: 5,972,743
[45] Date of Patent: Oct. 26, 1999

[54] PRECURSOR COMPOSITIONS FOR ION IMPLANTATION OF ANTIMONY AND ION IMPLANTATION PROCESS UTILIZING SAME

[75] Inventors: Timothy E. Glassman, Danbury; Thomas H. Baum, New Fairfield; James V. McManus, Danbury, all of Conn.; W. Karl Olander, Tampa, Fla.

[73] Assignee: Advanced Technology Materials, Inc., Danbury, Conn.

[21] Appl. No.: 08/759,761

[22] Filed: Dec. 3, 1996

[51] Int. Cl.$^6$ .................... H01L 21/338; H01L 21/331
[52] U.S. Cl. .................. 438/181; 438/369; 438/914
[58] Field of Search .................... 438/181, 369, 438/914

[56] References Cited

U.S. PATENT DOCUMENTS

| | | |
|---|---|---|
| 4,147,571 | 4/1979 | Stirngfellow et al. . |
| 4,496,843 | 1/1985 | Kirita et al. . |
| 4,734,514 | 3/1988 | Melas et al. . |
| 4,904,616 | 2/1990 | Bohling et al. . |
| 4,942,252 | 7/1990 | Hui et al. . |
| 4,949,004 | 8/1990 | Yamazaki et al. . |
| 4,960,916 | 10/1990 | Pazik . |
| 4,988,640 | 1/1991 | Bohling et al. . |
| 5,124,278 | 6/1992 | Bohling et al. . |
| 5,275,966 | 1/1994 | Gedridge, Jr. . |
| 5,326,425 | 7/1994 | Gedridge, Jr. . |
| 5,371,257 | 12/1994 | Gedridge, Jr. . |

OTHER PUBLICATIONS

"Sb Implantation for Bipolar Buried Layers Using SbF$_5$ in a Cold–Cathode Implantation System" by Oleszek, et al., Nuclear Instruments & Methods in Physics Research B6 (1985) pp. 389–393, North–Holland, Amsterdam.

"Advances in Ion Implanter Productivity and Safety" by Romig, et al., Solid State Technology, Dec. 1996, pp. 69–72.

*Primary Examiner*—John F. Niebling
*Assistant Examiner*—Josetta I. Jones
*Attorney, Agent, or Firm*—Steven J. Hultquist; Oliver A. M. Zitzmann

[57] ABSTRACT

A method for n-doping a material layer with antimony, comprising ion implanting antimony from an antimony precursor composition including a compound of the formula $SbX_n((CH_2)_ySiR_3)_{n-3}$, wherein: n is an integer having a value of 1 or 2; y is an integer having a value of from 1 to 3 inclusive; each R is independently selected from $C_1$–$C_4$ alkyl; and each X is independently selected from halo substituents. The antimony precursor composition may further include a fluorine-containing auxiliary gas, to effect in situ cleaning of the ionization chamber during ion implantation.

15 Claims, 1 Drawing Sheet

PRECURSOR COMPOSITIONS FOR ION IMPLANTATION OF ANTIMONY AND ION IMPLANTATION PROCESS UTILIZING SAME

BACKGROUND OF THE INVENTION

1. Field of the Invention

The present invention relates to a method for doping a material layer with antimony, by ion implantation.

2. Description of the Related Art

The reduction in critical dimensions necessary for continued gains in dynamic random access memory (DRAM) circuit density will require a number of fundamental changes from current practice, relative to the techniques and source materials employed in current manufacturing practice. As geometries of such DRAM devices decrease below 0.35 micrometer, a corresponding reduction is necessary in the size of p/n dopant layer thicknesses and in the associated dopant concentrations.

These factors, coupled with the need to precisely tailor ion implant distribution profiles, will greatly complicate the practice of ion implant technology in the manufacture of future generation memory devices. The mobility of lightweight boron (p-type) and phosphorous (n-type) dopants is too high, even with reduced thermal budgets, to accommodate the increased stringency of future implant requirements. Indium (p-type) and antimony (n-type), with their significantly greater size and mass, will need to be used to improve control of ion throughput and device threshold voltage, and to reduce channeling effects in the fabricated structures.

Beam current is roughly proportional to the extraction energy. Accordingly, use of lower energy acceleration for shallower implants of current dopants results in greatly decreased beam intensities. The trend to lower energies to shape reduced geometry implants has prompted an investigation of the use of larger fragments e.g., $BF_2$ rather than B per se. Fluorine, however, enhances diffusion of boron in $SiO_2$ which results in contamination of the well region and loss of threshold voltage control in the resulting devices. Greater control of ion implant profiles, using heavier ions such as indium and antimony in future DRAM manufacturing, will markedly reduce the need for angled implants which are currently required to prevent channeling and to effect required implant geometry.

Accordingly, the art is in need of new source compositions for elements such as indium and antimony, for ion implant applications.

U.S. Pat. No. 4,496,843 issued Jan. 29, 1985 to K. Kirita, et al., describes a method of producing metal ions of various metals. Antimony ion generation is described, utilizing trialkyl antimony compounds and trialkoxy antimony compounds. This patent also discloses the use of a fluoride gas as an auxiliary gas for preventing organic metal compound decomposition products from attaching to the inner wall of the arc discharge chamber during processing.

U.S. Pat. No. 4,988,640 issued Jan. 29, 1991 to D. A. Bohling, et al., describes the use of at least partially fluorinated organometallic compounds in reactive deposition (ion implant) applications, utilizing source compounds of the formula $MR_1R_2R_3$ wherein M is arsenic, phosphorous or antimony, and $R_1$, $R_2$ and $R_3$ are each, separately, hydrogen or an organic radical, wherein at least one R is an organic radical which is at least partially fluorinated. The organic radicals may be alkyl, cycloalkyl, aryl, alkenyl or arenyl.

U.S. Pat. No. 5,124,278 issued Jun. 23, 1992 to D. A. Bohling, et al., describes the use of amino-substituted metallic donor source compounds for reactive deposition (ion implant) applications. The disclosed source compounds have the formula $M(NR_2)_{3-x}H_x$, where R is an organic radical selected from the group consisting of alkyl, cycloalkyl, aryl, alkenyl, arenyl or fluoroalkyl, x is less than or equal to 2, and M is arsenic, antimony or phosphorous.

It is an object of the present invention to provide an improved source composition for ion implantation of antimony ions.

It is another object of the present invention to provide a source composition for n-doping a material layer with antimony by ion implantation, in which the source composition avoids deposition of certain ionization reaction by-products on interior (wall) surfaces of the ionization chamber of the ion implant system.

Other objects and advantages of the invention will be more fully apparent from the ensuing disclosure and appended claims.

SUMMARY OF THE INVENTION

The present invention relates to a method for n-doping a material layer with antimony, comprising ion-implanting antimony from an antimony precursor composition including a compound of the formula:

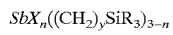

$$SbX_n((CH_2)_y SiR_3)_{3-n}$$

wherein:
n is an integer having a value of 1 or 2;
y is an integer having a value of from 1 to 3 inclusive;
each R is independently selected from $C_1$–$C_4$ alkyl; and
each X is independently selected from halo substituents.

In one preferred aspect of such method, in the compound of the above formula, each R preferably is methyl, the halogen substituents X preferably are each Cl, n is 1 and y is 1.

In another preferred aspect, the antimony precursor composition further includes a fluorine-containing auxiliary gas, to effect in situ cleaning of the ion implantation reactor (arc discharge chamber). Such fluorine-containing gas may for example comprise one or more of $CF_4$, $CF_3H$, $C_2F_6$, $NF_3$, $SF_6$, $BF_3$, $SiF_4$, $AsF_3$ and $AsF_5$.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
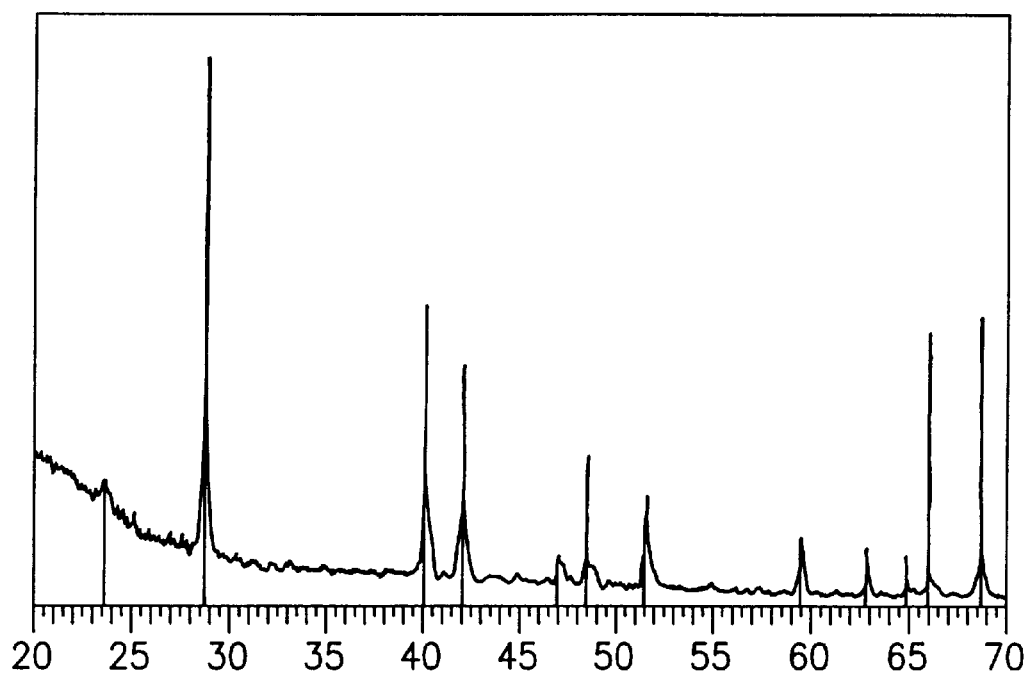
FIG. 1 is an x-ray diffraction spectrum of antimony metal as the product of pyrolysis of $SbCl_2(CH_2Si(CH_3)_3)$.

The present invention is based on the discovery that antimony precursor compounds of the formula $SbX_n((CH_2)_y SiR_3)_{3-n}$ may be employed for n-doping a material layer with antimony, by ion implantation wherein each R is independently selected from $C_1$–$C_4$ alkyl, each X is independently selected from halo substituents, n is an integer having a value of 1 or 2, and y is an integer having a value of from 1 to 3 inclusive.

Each R in the above formula may, for example, be independently selected from methyl, ethyl, propyl and butyl substituents, and each X may be independently selected from fluoro, bromo, iodo, and chloro. Preferably R is methyl, X is chloro, fluoro, or bromo, and n and y are each 1.

Although ion implantation is an old and well-established technology for incorporation of ion species in material layers, e.g., for doping thereof in the manufacture of semiconductor materials and devices, and although ion implantation of antimony from organometallic source compounds is known, trialkylsilylmethyl antimony dihalide compounds have not been contemplated for ion implantation of antimony. In fact, to our knowledge, silicon-containing antimony source compounds have not been proposed for ion implantation applications.

One possible reason that silicon-containing antimony compounds has not been employed in the prior art practice of ion implantation of antimony may be an expectation that the arc discharge ion generation from such compounds would result in hard-to-remove siliceous deposits on the walls and interior surfaces of the ionization chamber of the ion implant system, as reaction by-products of the ion implantation operation.

The present invention, however, contemplates avoidance of such siliceous reaction by-product deposition problems by the provision of a fluorine-containing gas as an auxiliary gas provided with the antimony source compound vapor and passed to the ionization chamber of the ion implant system.

The fluorine-containing auxiliary gas may for example include one or more of the species $CF_4$, $CF_3H$, $C_2F_6$, $NF_3$, $SF_6$, $BF_3$, $SiF_4$, $AsF_3$ and $AsF_5$. Of the foregoing gas species, $CF_4$, $CF_3H$, $C_2F_6$, $NF_3$, and $SF_6$, are preferred.

Thus, a preferred composition for ion implantation of antimony comprises a compound such as $SbCl_2(CH_2Si(CH_3)_3)$ or $SbBr_2(CH_2Si(CH_3)_3)$, in combination with a fluorine-containing auxiliary gas selected from $CF_4$, $CF_3H$, $C_2F_6$, $NF_3$, $SF_6$, $BF_3$, $SiF_4$, $AsF_3$, and $AsF_5$.

It may also be desirable to use an antimony source compound such as $SbF_2(CH_2Si(CH_3)_3)$, either with or without a fluorine-containing auxiliary gas, to provide an antimony source compound which also is a source of fluorine ions for in situ cleaning of the ionization chamber.

The ion implantation substrate may be any suitable material such as a silicon material, e.g., a silicon epitaxial or polycrystalline material.

Utilizing the ion implantation source composition of the invention, antimony ions may be generated for the ion implantation process in a known manner, as for example by the apparatus and method described in U.S. Pat. No. 4,496,843, the disclosure of which is hereby incorporated herein in its entirety. The ion implantation process conditions for a given application of the source compositions of the invention may be optimally determined without undue experimentation by the expedient of varying the process conditions differentially, and determining the character of the resulting ion-implanted substrate material produced.

FIG. 1 is an x-ray diffraction spectrum of $SbCl_2(CH_2Si(CH_3)_3)$ pyrolysis product, showing the metallic antimony lines in the spectrum. Thermolysis data show that the antimony source compounds of the invention are thermally unstable and readily decompose to yield elemental antimony under ion implant arc discharge conditions.

The use of the auxiliary gases containing fluorine assist in removing residue, including carbonaceous and siliceous residues, from the ionization chamber of the ion implantation system, thereby providing an in situ cleaning of the ionization chamber.

While the invention has been described herein with reference to illustrative aspects, features and embodiments, it will be appreciated that the utility of the invention is not thus limited, but rather extends to and encompasses numerous other aspects, features and embodiments. Accordingly, the invention as hereafter claimed is to be correspondingly broadly construed, as encompassing all such other variations, modifications and other embodiments within its spirit and scope.

What is claimed is:

1. A method for n-doping a material layer with antimony, comprising ion implanting antimony from an antimony precursor composition including a compound of the formula:

$$SbX_n((CH_2)_ySiR_3)_{3-n}$$

wherein:
n is an integer having a value of 1 or 2;
y is an integer having a value of from 1 to 3 inclusive;
each R is independently selected from $_1$–$C_4$ alkyl; and
each X is independently selected from halo substituents.

2. A method according to claim 1, wherein each R is methyl.

3. A method according to claim 1, wherein each X is independently selected from the group consisting of Cl, F and Br.

4. A method according to claim 1, wherein n is 1.

5. A method according to claim 1, wherein y is 1.

6. A method according to claim 1, wherein the antimony precursor composition further includes a fluorine-containing auxiliary gas.

7. A method according to claim 6, wherein the fluorine-containing auxiliary gas is selected from the group consisting of $CF_4$, $CF_3H$, $C_2F_6$, $NF_3$, $SF_6$, $BF_3$, $SiF_4$, $AsF_3$ and $AsF_5$.

8. A method according to claim 1, wherein each R is methyl, and each X is Cl.

9. A method according to claim 1, wherein said compound is $SCl_2(CH_2Si(CH_3)_3)$.

10. A method according to claim 1, wherein said compound is $SbBr_2(CH_2Si(CH_3)_3)$.

11. A method according to claim 1, wherein said antimony precursor composition includes the compound $SbCl_2(CH_2Si(CH_3)_3)$ and a fluorine-containing auxiliary gas.

12. A method according to claim 1, wherein the fluorine-containing auxiliary gas is selected from the group consisting of $CF_4$, $CF_3H$, $C_2F_6$, $NF_3$, $SF_6$, $AsF_3$ and $AsF_5$.

13. A method according to claim 1, wherein the fluorine-containing auxiliary gas is selected from the group consisting of $CF_4$, $CF_3H$, $C_2F_6$, $NF_3$, and $SF_6$.

14. A method according to claim 1, wherein the material layer comprises a silicon material.

15. A method according to claim 1, wherein the material layer comprises a silicon epitaxial or polycrystalline material.

* * * * *

UNITED STATES PATENT AND TRADEMARK OFFICE
CERTIFICATE OF CORRECTION

PATENT NO : 5,972,743

DATED : October 26, 1999

INVENTOR(S) : Glassman et al.

It is certified that error appears in the above-identified patent and that said Letters Patent is hereby corrected as shown below:

Column 4, line 26, insert -- C -- before "1".

Signed and Sealed this

Sixth Day of June, 2000

Attest:

Attesting Officer

Q. TODD DICKINSON

Director of Patents and Trademarks

UNITED STATES PATENT AND TRADEMARK OFFICE
CERTIFICATE OF CORRECTION

PATENT NO. : 5,972,743
DATED : October 26, 1999
INVENTOR(S) : Timothy E. Glassman, et. al.

It is certified that error appears in the above-identified patent and that said Letters Patent is hereby corrected as shown below:

Column 1, line 36: after "fragments" insert --,--.
Column 4, line 26: change "$_1$-C$_4$" to --C$_1$-C$_4$--.
Column 4, line 54: after "SF$_6$," insert --BF$_3$, SiF$_4$--.

Signed and Sealed this

Twenty-sixth Day of December, 2000

Attest:

Q. TODD DICKINSON

*Attesting Officer*  *Director of Patents and Trademarks*